(12) United States Patent
Hwang

(10) Patent No.: US 7,868,373 B2
(45) Date of Patent: Jan. 11, 2011

(54) FLASH MEMORY DEVICE AND A METHOD OF FABRICATING THE SAME

(75) Inventor: Joo Won Hwang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 197 days.

(21) Appl. No.: 11/839,038

(22) Filed: Aug. 15, 2007

(65) Prior Publication Data

US 2008/0042187 A1 Feb. 21, 2008

(30) Foreign Application Priority Data

Aug. 17, 2006 (KR) ...................... 10-2006-0077508

(51) Int. Cl.
*H01L 29/788* (2006.01)
(52) U.S. Cl. ............... 257/315; 257/321; 257/E29.129; 257/E29.3
(58) Field of Classification Search ......... 438/142–308; 257/321, 261, 314, 315, 317, 320, E29.129, 257/E29.3, E29.179, E21.422, E21.68; *H01L 21/8247, H01L 21/336, 29/788*
See application file for complete search history.

(56) References Cited

U.S. PATENT DOCUMENTS

| | | | | |
|---|---|---|---|---|
| 6,153,904 A | * | 11/2000 | Yang | ............................ 257/316 |
| 6,174,759 B1 | * | 1/2001 | Verhaar et al. | ............... 438/201 |
| 6,696,331 B1 | | 2/2004 | Yang et al. | ................... 438/211 |
| 6,812,105 B1 | | 11/2004 | Dokumaci et al. | ........... 438/300 |
| 7,141,475 B2 | * | 11/2006 | Adachi et al. | ................ 438/258 |
| 7,154,779 B2 | * | 12/2006 | Mokhlesi et al. | ........ 365/185.01 |
| 7,371,654 B2 | * | 5/2008 | Sato et al. | .................... 438/424 |
| 2003/0003657 A1 | * | 1/2003 | Kim et al. | .................... 438/257 |
| 2005/0233532 A1 | | 10/2005 | Lenski et al. | ............... 438/301 |
| 2006/0022259 A1 | * | 2/2006 | Kobayashi et al. | .......... 257/321 |

(Continued)

FOREIGN PATENT DOCUMENTS

CN 1431715 7/2003

(Continued)

OTHER PUBLICATIONS

Translation of Office Action for corresponding Chinese Application No. 200710145274.X, dated Jul. 18, 2008.

*Primary Examiner*—Asok K Sarkar
*Assistant Examiner*—Julia Slutsker
(74) *Attorney, Agent, or Firm*—Marshall, Gerstein & Borun LLP

(57) ABSTRACT

The invention relates to a flash memory device and its method of fabrication. The method includes the steps of: forming gate protection patterns over a peripheral region of a semiconductor substrate; forming a tunnel insulating film over the semiconductor substrate; forming a first conductive film over the tunnel insulating film between adjacent gate protection patterns; forming a dielectric film over the first conductive film and the gate protection patterns; etching a portion of the dielectric film in the peripheral region to expose a portion of the first conductive film between adjacent gate protection patterns; forming a second conductive film over the dielectric film and the first conductive film; and etching the second conductive film, the dielectric film, the first conductive film, the tunnel insulating film and the gate protection patterns to form a gate, wherein the gate protection patterns remain on the sidewalls of the first conductive film and the tunnel insulating film in the peripheral region.

6 Claims, 2 Drawing Sheets

U.S. PATENT DOCUMENTS

2006/0057794 A1 * 3/2006 Youn et al. .................. 438/197
2006/0118857 A1 * 6/2006 Jeong ......................... 257/316

FOREIGN PATENT DOCUMENTS

| | | | |
|---|---|---|---|
| CN | 1790718 | | 6/2006 |
| KR | 20030001960 | * | 1/2003 |
| KR | 20030049356 | * | 6/2003 |
| KR | 10-2003-0093384 | | 12/2003 |
| KR | 10-2005-0069566 | | 7/2005 |

* cited by examiner

FLASH MEMORY DEVICE AND A METHOD OF FABRICATING THE SAME

CROSS-REFERENCE TO RELATED APPLICATION

The priority to Korean patent application number 2006-77508, filed on Aug. 17, 2006, the disclosure of which is incorporated by reference in its entirety, is claimed.

BACKGROUND OF THE INVENTION

The invention relates in general to flash memory devices and, more particularly, to a method of fabricating a flash memory device in which transistors of a peripheral region are protected by using a nitride-containing film.

In general, in fabricating a flash memory device, a gate etch process is performed by using a cell target having a high density in order to define the cell region and the peripheral region. In this case, since the respective densities of transistors formed in the cell region and the peripheral region differ, there is a loading difference in the gate etch process. If the gate is etched so that bridges are not generated in the floating gate of the cell region, the tunnel oxide film of the peripheral region is damaged. The tunnel oxide film is damaged by plasma because the transistor of the peripheral region has a density relatively lower than that of the transistor of the cell region. This defect greatly changes the characteristics of the transistor. For example, in the case of an NMOS transistor, conductance (Gm) is lower and hot carrier injection (HCI) is further accelerated, further reducing a hot carrier maintenance time. Accordingly, an efficient channel length cannot be secured since the range of the drain is expanded. This phenomenon also occurs in a PMOS transistor, resulting in a leakage current occurring in an ion junction portion of the device.

SUMMARY OF THE INVENTION

Accordingly, the invention addresses the above problems, and can prevent damage to transistors upon a gate etch process by forming a gate protection film before a tunnel oxide film is formed in the peripheral region.

In an aspect of the invention, a method of fabricating a flash memory device is provided, the method including the steps of forming a gate protection pattern over a peripheral region of a semiconductor substrate, forming a tunnel insulating film over the semiconductor substrate in which the protection pattern is formed, forming a first conductive film over the tunnel insulating film between adjacent gate protection patterns forming a dielectric film over the first conductive film and the gate protection patterns etching a portion of the dielectric film in the peripheral region to expose a portion of the first conductive film between adjacent gate protection patterns, forming a second conductive film over the dielectric film and the first conductive film, and etching the second conductive film, the dielectric film, the first conductive film, the tunnel insulating film and the gate protection patterns to form a gate, wherein the gate protection patterns remain on sidewalls of both the first conductive film and the tunnel insulating film in the peripheral region.

DESCRIPTION OF SPECIFIC EMBODIMENTS

Now, a specific embodiment according to the disclosure is described with reference to the accompanying drawings.

FIGS. 1 to 6 are cross-sectional views illustrating a method of fabricating a flash memory device according to an embodiment of the invention.

Figure 1:
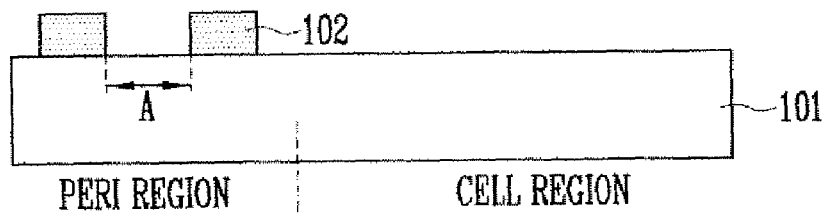
FIGS. 1 to 6 are cross-sectional views illustrating a method of fabricating a flash memory device according to an embodiment of the invention.

Referring to FIG. 1, a gate protection layer (not shown) is formed over a semiconductor substrate 101 having a defined peripheral region and a defined cell region. The gate protection layer is preferably a nitride-containing layer, for example a nitride film or an oxide-nitride film. The gate protection layer is etched by using a mask so that gate protection patterns 102 are formed in the peripheral region. A distance between the adjacent gate protection patterns 102 is a width A, which is preferably less than half the length of a gate to be subsequently formed in the peripheral region. In other words, when a first polysilicon film and a second polysilicon film are formed in a subsequent process and brought in contact with each other, the width A is preferably less than half the gate length.

Figure 2:
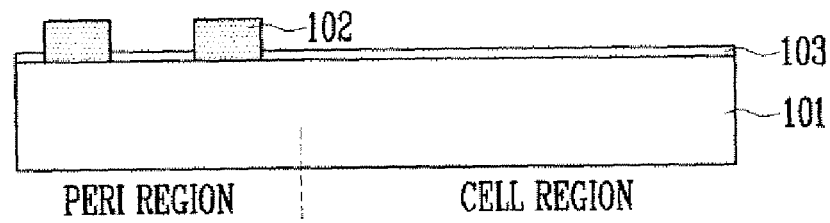

Referring to FIG. 2, a tunnel insulating film 103 is formed over the semiconductor substrate 101. At this time, the tunnel insulating film 103 can be permitted to remain on the sidewalls of the gate protection patterns 102. However, it is preferable to remove the tunnel insulating film 103 from the sidewalls of the gate protection patterns 102, as illustrated in FIG. 2.

Figure 3:
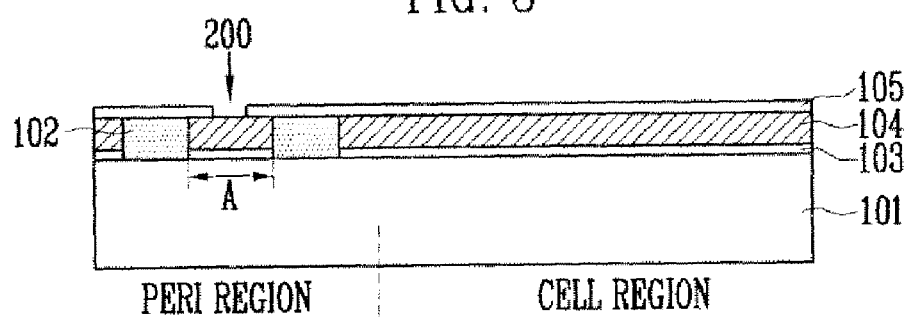

Referring to FIG. 3, a first conductive film 104 for a floating gate is formed over the tunnel insulating film 103. The first conductive film 104 preferably is polished by a Chemical Mechanical Polishing (CMP) process until the gate protection patterns 102 are exposed. As illustrated in FIG. 3, the height of the gate protection pattern 102 is greater than the height of the tunnel insulating film 103 and is the same as the combined height of the tunnel insulating film 103 and the first conductive film 104. Preferably, the height of the gate protection pattern 102 is the same as or smaller than the combined height of the tunnel insulating film 103 and the first conductor film 104. The first conductive film 104 preferably includes a polysilicon film. A dielectric film 105 is formed over the first conductive film 104. A portion of the dielectric film 105 formed in the peripheral region is selectively etched to expose the first conductive film 104. In this case, an etched region 200 of the dielectric film 105 is located between the adjacent gate protection patterns 102 and the etched region 200 is narrower than the width A between the adjacent gate protection patterns 102.

Figure 4:
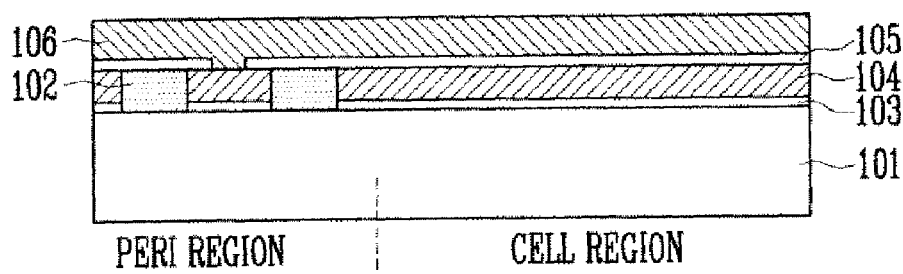

Then, the first conductive film 104 and a second conductive film 106 are connected as illustrated in FIG. 4.

The second conductive film 106 for a control gate is formed over the exposed portion of first conductive film 104 and the tunnel insulating film 105. The top surface of the second conductive film 106 is polished by CMP. The second conductive film 106 preferably includes a polysilicon film. A low resistance film (e.g., $WSi_x$) or hard mask nitride preferably is formed over the second conductive film 106.

Figure 5:
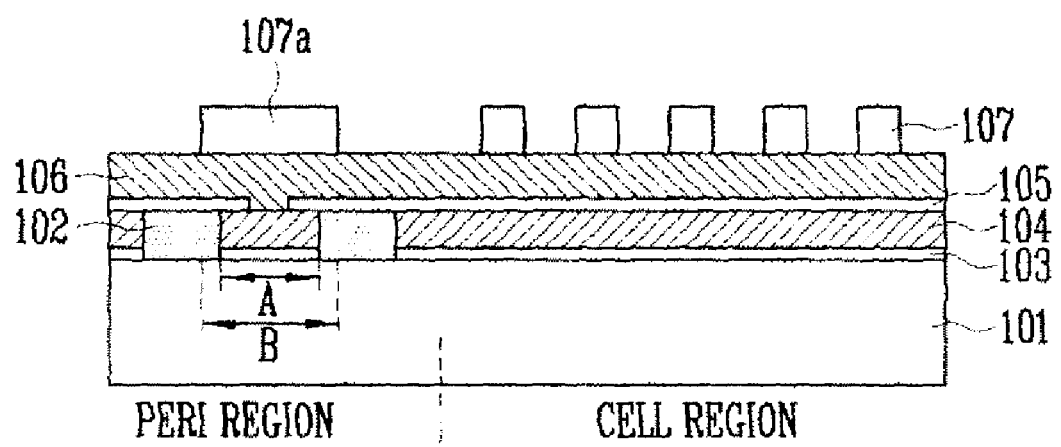

Referring to FIG. 5, mask patterns 107, 107a for a gate are formed over the second conductive film 106. The mask pattern 107a formed in the peripheral region has a width B. The width B of a mask pattern 107a is preferably greater than the width A between the adjacent gate protection patterns 102. Further, the width B of the mask pattern 107a is preferably the same as the width of a gate to be formed in the peripheral region.

Figure 6:
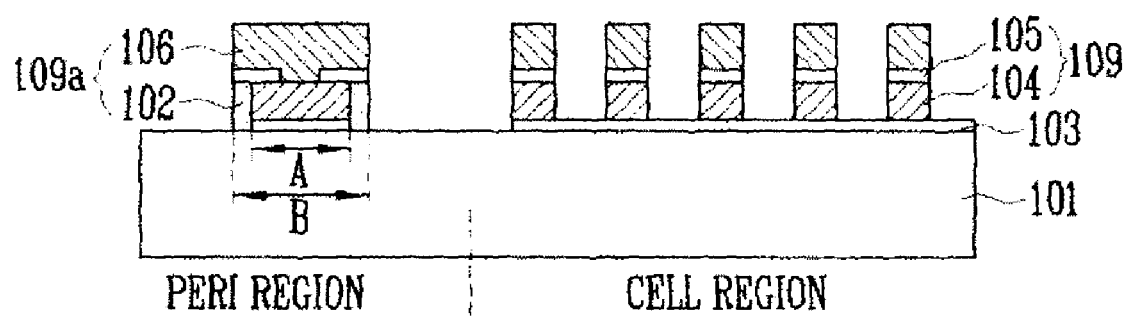

Referring to FIG. 6, a dry etch process is performed using the mask patterns 107 and 107a of FIG. 5 to form a gate pattern or transistor 109a of the peripheral region and a gate pattern or memory cell 109 of the cell region. The gate pattern 109a of the peripheral region includes the gate protection patterns 102, the tunnel insulating film 103, the first conductive film 104, the dielectric film 105 and the second conductive film 106. The gate protection patterns 102 remain on the sidewalls of the tunnel insulating film 103 and the first conductive film 104. Similarly, the gate pattern 109 of the cell region includes the tunnel insulating film 103, the first conductive film 104, the dielectric film 105 and the second conductive film 106. At this time, the gate protection patterns 102 can form a step with the dielectric film 105 depending on a gate etch selectivity. As illustrated in FIG. 6, no step is formed and the width of the second conductive film 106 is the same as the combined width of the gate protection pattern 102 and the first conductive film 104. The step between the gate protection patterns 102 and the dielectric film 105 preferably has a width of less than half the distance between adjacent gates in order to protect the gate at the time of a subsequent process. Further, the width of the etched gate protection patterns is preferably less than half the width the resulting gate.

As mentioned above, according to the invention, the gate protection pattern of the peripheral region preferably includes a nitride or an oxide-nitride. Thus the sidewall of the gates can be protected from plasma etching and the characteristics of the gates can be prevented from being degraded.

Although the foregoing description has been made with reference to a specific embodiment, changes and modifications of the disclosure may be made by the ordinarily skilled artisan without departing from the spirit and scope of the disclosure and appended claims.

What is claimed is:

1. A flash memory device comprising:
    gate protection patterns formed over a peripheral region of a semiconductor substrate;
    a tunnel insulating film and a first conductive film formed over a cell region of a semiconductor substrate and formed between the gate protection patterns of the peripheral region;
    a dielectric film formed over the first conductive film of the cell region and formed over the first conductive film and the gate protection patterns of the peripheral region;
    a contact hole in the dielectric film of the peripheral region; and
    a second conductive film formed over the dielectric film of the cell region and formed over the dielectric film including the contact hole of the peripheral region, wherein the first conductive film and the second conductive film are electrically connected by the contact hole of the peripheral region.

2. The flash memory device of claim 1, wherein the gate protection patterns comprise a nitride film.

3. The flash memory device of claim 1, wherein the gate protection patterns comprise an oxide-nitride film.

4. The flash memory device of claim 1, wherein a width of the gate protection patterns is less than half of a width of the first conductive film.

5. The flash memory device of claim 1, wherein a height of the gate protection patterns is the same as the height of the first conductive film and the tunnel insulating film.

6. The flash memory device of claim 1, wherein the first conductive film of the cell region is a floating gate and the second conductive film of the cell region is a control gate.

* * * * *